United States Patent
Ogawa

(10) Patent No.: US 8,653,431 B2
(45) Date of Patent: Feb. 18, 2014

(54) PHOTOELECTRIC CONVERSION DEVICE AND IMAGE SENSOR

(75) Inventor: Shimpei Ogawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 351 days.

(21) Appl. No.: 13/231,456

(22) Filed: Sep. 13, 2011

(65) Prior Publication Data

US 2012/0068049 A1   Mar. 22, 2012

(30) Foreign Application Priority Data

Sep. 16, 2010  (JP) ................................ 2010-207409
Jul. 29, 2011  (JP) ................................ 2011-167109

(51) Int. Cl.
    *H01L 27/146* (2006.01)
(52) U.S. Cl.
    USPC ..................................................... 250/208.1
(58) Field of Classification Search
    USPC .............. 250/208.1, 216, 226; 385/129–131; 359/290, 302
    See application file for complete search history.

(56) References Cited

U.S. PATENT DOCUMENTS

| | | | |
|---|---|---|---|
| 5,685,919 A | 11/1997 | Saito et al. | |
| 6,127,624 A | 10/2000 | Ishida et al. | |
| 7,768,654 B2 * | 8/2010 | Cui et al. | 356/521 |
| 7,933,019 B2 * | 4/2011 | Chung et al. | 356/445 |
| 7,982,883 B2 * | 7/2011 | Cui et al. | 356/521 |
| 7,989,254 B2 * | 8/2011 | Yoon | 438/70 |
| 2005/0233493 A1 | 10/2005 | Augusto | |
| 2007/0262405 A1 | 11/2007 | Furuyama | |
| 2008/0047600 A1 | 2/2008 | Ohashi et al. | |

FOREIGN PATENT DOCUMENTS

| | | |
|---|---|---|
| JP | 8-264821 | 10/1996 |
| JP | 10-340742 | 12/1998 |
| JP | 2006-509358 | 3/2006 |
| JP | 2007-248141 | 9/2007 |
| JP | 2008-53615 | 3/2008 |

OTHER PUBLICATIONS

U.S. Appl. No. 13/783,537, filed Mar. 4, 2013, Ogawa.

* cited by examiner

*Primary Examiner* — Seung C Sohn
(74) *Attorney, Agent, or Firm* — Oblon, Spivak, McClelland, Maier & Neustadt, L.L.P.

(57) ABSTRACT

There is provided a photoelectric conversion device utilizing surface plasmons, including: a plate-shaped light receiving portion which made of metal, provided on a most superficial surface of the photoelectric conversion device, and having a front surface and a rear surface so as to receive incident light at the front surface; a slot-shaped slit provided in the front surface of the light receiving portion; and a voltage detection portion adapted to measure an electric potential at the front surface of the light receiving portion; wherein the incident light is caused to excite surface plasmons through the slit, and an electric potential at the front surface of the light receiving portion induced by the surface plasmons is measured by the voltage detection portion.

9 Claims, 6 Drawing Sheets

PHOTOELECTRIC CONVERSION DEVICE AND IMAGE SENSOR

BACKGROUND OF THE INVENTION

1. Field of the Invention

The present invention relates to photoelectric conversion devices for converting light into electric currents through plasmonics, and image sensors employing the photoelectric conversion devices.

2. Description of the Related Art

As photoelectric conversion devices utilizing conventional photoelectric conversion techniques, devices utilizing semiconductor band gaps, such as photo diodes and quantum-type infrared sensors, have been mainly used, but such devices cannot have resolutions exceeding light diffraction limits. For example, in cases where semiconductor photoelectric conversion devices are applied to sensors, there has been the problem of detection limits caused by the light diffraction limits. To cope therewith, there have been proposed photoelectric conversion devices adapted to convert surface plasmons, which induce no diffraction limits, into electric currents (JP 8-264821, A, for example).

SUMMARY OF THE INVENTION

However, in order to excite the surface plasmons, there has been a need for incidence of light to the front surfaces of such photoelectric conversion devices at predetermined angles, which has necessitated prisms. Particularly, in cases where a photoelectric conversion device is used in an image sensor, the most part of incident light enters the front surface of the photoelectric conversion device perpendicularly thereto, which has induced the problem that the incident light cannot excite surface plasmons. Furthermore, in order to extract an electric current therefrom, there has been a need for two electrodes, including one on the rear surface of the photoelectric conversion device.

Therefore, it is an object of the present invention to provide a photoelectric conversion device capable of exciting surface plasmons even with perpendicular incident light, without using a prism and the like.

Specifically, according to the present invention, there is provided a photoelectric conversion device which utilizes surface plasmons, and the photoelectric conversion device includes a plate-shaped light receiving portion which is made of metal, is provided on a most superficial surface of the photoelectric conversion device, and has a front surface and a rear surface in such a way as to receive incident light at the front surface; a slot-shaped slit provided in the front surface of the light receiving portion; and a voltage detection portion adapted to measure an electric potential at the front surface of the light receiving portion, wherein the incident light is caused to excite surface plasmons through the slit, and an electric potential at the front surface of the light receiving portion caused by the surface plasmons is measured by the voltage detection portion.

As described above, the photoelectric conversion device according to the present invention can induce surface plasmons even with perpendicular incident light, through the slit structure, which enables detection of incident light with a simple structure without inducing a diffraction limit.

DETAILED DESCRIPTION OF THE PREFERRED EMBODIMENTS

First Embodiment

Figure 1:
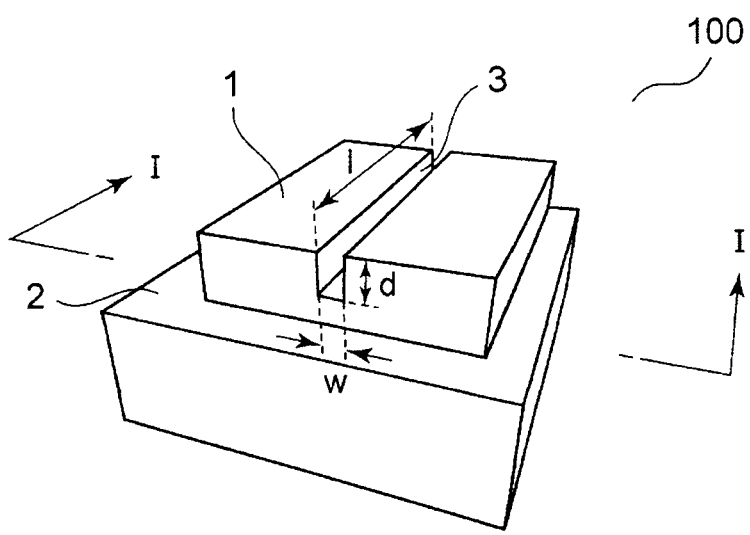
FIG. 1 is a perspective view of a photoelectric conversion device according to a first embodiment of the present invention.
Figure 2:
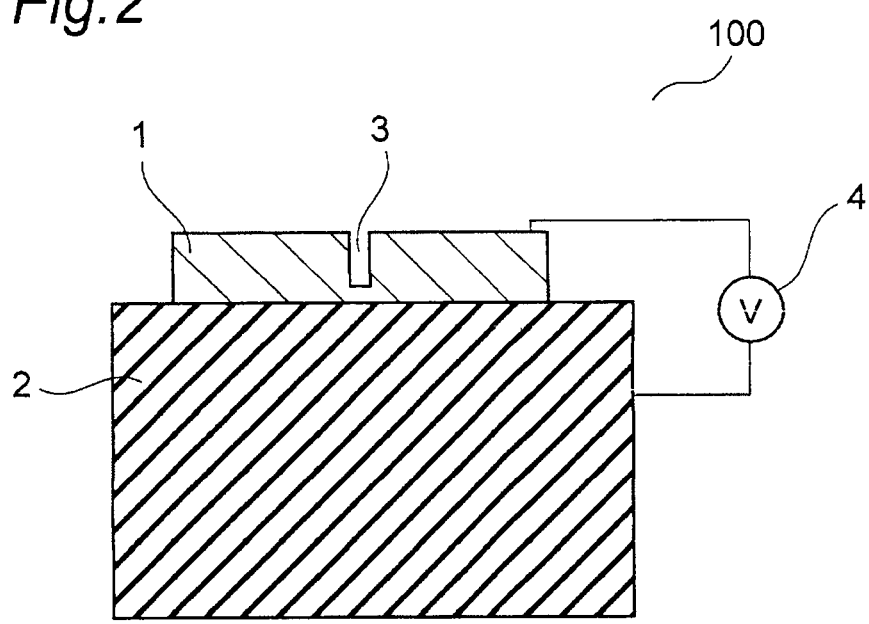
FIG. 2 is a cross-sectional view of the photoelectric conversion device according to the first embodiment of the present invention.

FIG. 1 is a perspective view of an entire photoelectric conversion device 100 according to a first embodiment of the present invention, and FIG. 2 is a cross-sectional view of the photoelectric conversion device of FIG. 1, taken along the direction of I-I.

The photoelectric conversion device 100 includes a supporting substrate 2 and a light receiving portion 1 formed thereon. The supporting substrate 2 is required only to have an insulating characteristic and hold the light receiving portion 1, and is made of silicon or glass, for example. The light receiving portion 1 is made of a metal which can excite surface plasmons therein, and the light receiving portion 1 is made of gold or silver, for example. The light receiving portion 1 is formed on the supporting substrate 2 through sputtering, vapor deposition, plating, or the like. However, when the light receiving portion 1 has a sufficient thickness, the supporting substrate 2 is unnecessary.

As illustrated in FIGS. 1 and 2, the light receiving portion 1 is provided with a slot-shaped slit (nanoslit) 3 which extends in a predetermined direction. The slit 3 desirably has a width w of several hundred nanometers, and a depth d of 5 micrometers or less. The width of the slit is determined in such a way as to attain maximum coupling efficiency for a wavelength desired to be detected. The slit 3 is formed by forming a mask on the light receiving portion 1 through lithography or nano-imprint utilizing an electric beam drawing, and by performing, thereon, ion beam etching or FIB using the mask.

Figure 3:
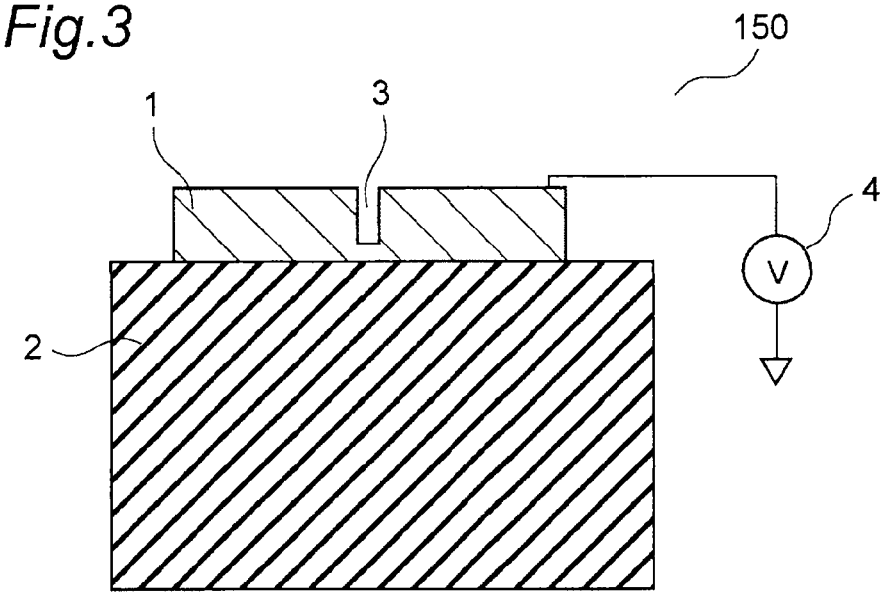
FIG. 3 is a cross-sectional view of a different photoelectric conversion device according to the first embodiment of the present invention.

Further, the photoelectric conversion device 100 includes a voltage detection portion 4 for measuring the voltage between the light receiving portion 1 and the supporting substrate 2. The voltage detection portion 4 is constituted by an electronic circuit having an ordinary voltage detecting function, for example, and is adapted to measure the electric potential at the front surface of the light receiving portion 1. In the photoelectric conversion device 100 of FIG. 2, a reference point for the voltage measurement is on the supporting substrate 2, but it is also possible to ground the supporting substrate 2. Further, as a photoelectric conversion device 150 illustrated in FIG. 3, for example, a grounded point can be provided outside thereof.

Next, the principle of operations of the photoelectric conversion device 100 will be described.

At first, studies will be conducted on a photoelectric conversion device having no slit (in a case where the light receiving portion 1 does not have the slit 3 in FIG. 2). Light propagates through a medium 1 (vacuum), then enters a medium 2 (the light receiving portion 1), and is converted into surface plasmons at the boundary surface therebetween. Assuming that the angular frequency of the incident light is $\omega$, the wavenumber thereof is k, the wavenumber thereof in the direction of surface plasmon propagation is kx, the velocity of light in a vacuum is c, the permittivity of the medium 1 through which the light propagates is $\epsilon 1$, and the refractive index thereof is n, the permittivity of the medium 2 into which the light enters is $\epsilon 2$, and the incident angle (the angle formed between the incident light and a line perpendicular to the incidence surface) is $\theta$, the following relation holds in general.

$$k_x = \frac{\omega}{c}\left(\sqrt{\frac{\varepsilon_1 \varepsilon_2}{\varepsilon_1 + \varepsilon_2}}\right) \quad \text{(Equation 1)}$$

Further, in cases where a complex permittivity is set as the permittivity, the following relation holds.

$$R(k_x) = \frac{\omega}{c} R\left(\sqrt{\frac{\hat{\varepsilon}_1 \hat{\varepsilon}_2}{\hat{\varepsilon}_1 + \hat{\varepsilon}_2}}\right) \quad \text{(Equation 2)}$$

In this case, the permittivity $$\hat{\epsilon}_1 \hat{\epsilon}_2$$

is a normalized permittivity, and R engaged with the parenthesis indicates the real part of the content in the parenthesis. This dispersion relation does not agree with the following equation indicating the dispersion relation in a vacuum, in terms of the coefficient.

$$k = \frac{\omega}{c} \quad \text{(Equation 3)}$$

Accordingly, it can be understood that plasmon resonance cannot be induced in a vacuum.

On the other hand, by using an evanescent wave which exhibits a dispersion relation closer thereto, it is possible to induce plasmon resonance, thereby exciting surface plasmons. In this case, the dispersion relation of an evanescent wave can be expressed as follows.

$$k = \frac{\omega}{c} n \sin\theta \quad \text{(Equation 4)}$$

Accordingly, the condition required for exciting surface plasmons is expressed by the following equation, according to Equation 1 and Equation 4.

$$\sin\theta = \frac{1}{n}\left(\sqrt{\frac{\varepsilon_1 \varepsilon_2}{\varepsilon_1 + \varepsilon_1}}\right) \quad \text{(Equation 5)}$$

Figure 4:
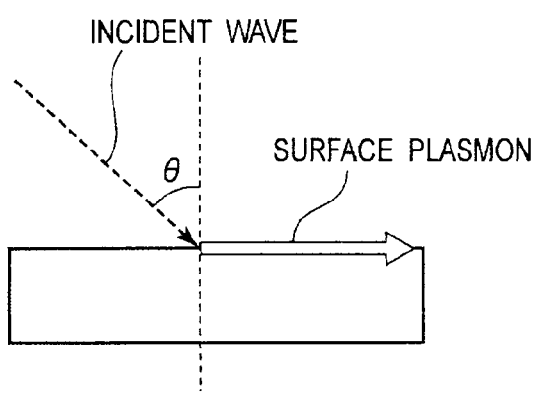
FIG. 4 is a schematic view of a light receiving portion having no slit, for describing the principle of the first embodiment of the present invention.

More specifically, in order to excite surface plasmons, it is necessary to adjust the incident angle $\theta$ such that Equation 5 holds, for attaining matching therebetween (surface plasmon resonance). Accordingly, in JP 8-264821, A referred to above, there is strong incident angle dependency in excitation of surface plasmons. In other words, in cases of employing a flat structure having no slit as described in JP 8-264821, A substantially no surface plasmon is induced by incident light perpendicular thereto. Therefore, there is a need for adjustment of the incident angle $\theta$ using a prism or the like. For example, in FIG. 4, the incident angle $\theta$ is adjusted such that the direction of incidence is aligned to an oblique direction (a direction designated by a broken line), in such a way as to hold the condition (Equation 5) required for excitation of surface plasmons.

Next, there will be described the photoelectric conversion device 100 having the slit 3 according to the first embodiment. In this case, assuming that the slit 3 has a slit width of w and a depth of d, and the incident wave to be detected has a wavelength of $\lambda$, the value of w is at least made to be equal to or less than about $\lambda/2$. In this case, no higher-order diffracted light is induced, and therefore the incident wave forms a waveguide mode of strongly resonating in the slit 3. Further, the reflected wave which is reflected from the slit forms a quasi-cylindrical wave which is centered on the slit.

Figure 5:
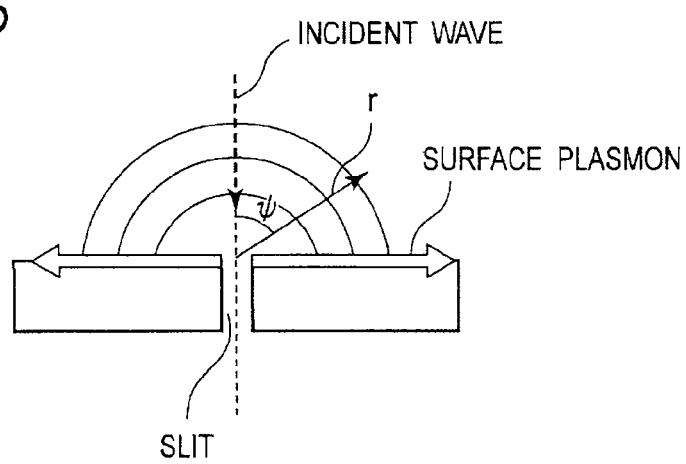
FIG. 5 is a schematic view of a light receiving portion having a slit, for describing the principle of the first embodiment of the present invention.

In the case where the reflected wave is a cylindrical wave, as illustrated in FIG. 5, the reflected wave can be expressed by Equation 6, for all directions $\psi$, using a cylindrical graphic system which is centered on the slit 3 and defines the distance from the slit 3 as r, assuming that r is sufficiently large and A is a constant.

$$\frac{A}{\sqrt{r}} \exp ikr \quad \text{(Equation 6)}$$

Specifically, a portion of perpendicular incident light is converted, by the slit 3, into a cylindrical wave having a component of $\phi=90°$ (which is parallel to the front surface of the light receiving portion 1). Since there is provided a wavenumber component of kx at the front surface of the light receiving portion 1, the matching (plasmon resonance) relation for the wavenumber indicated by Equation 1 is satisfied, at the front surface of the light receiving portion 1 at the opposite ends of the slit 3. By forming the slit 3 with the slit width w in the metal front surface as described above, it is possible to overcome the mismatching relation of Equation 5 even for perpendicular incident light ($\theta=0$), thereby enabling coupling the wavenumber k of incident light to the surface plasmon mode.

As described above, by providing the slit 3 in the light receiving portion 1, it is possible to convert light incident to the front surface of the light receiving portion 1 perpendicularly thereto, into electromagnetic waves (surface plasmons or surface plasmon polaritons) propagating along the front surface due to propagation of free electron waves near the metal front surface. This eliminates the necessity of a prism for adjusting the incident angle θ, which has been necessary for structures provided with no slit. Further, the electric potential at the front surface of the light receiving portion 1 is detected by the voltage detection portion 4, so that the intensity of the incident light can be detected.

Figure 6:
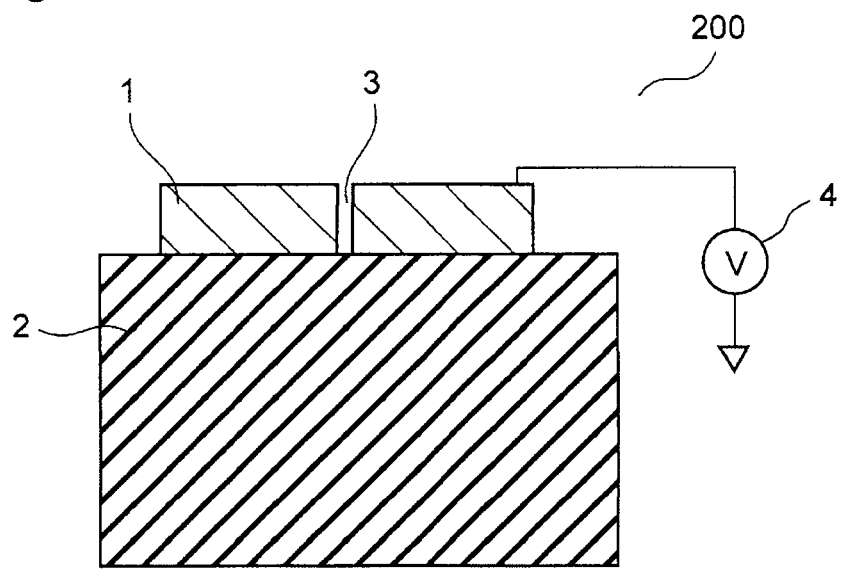
FIG. 6 is a cross-sectional view of a different photoelectric conversion device according to the first embodiment of the present invention.

Further, as in a photoelectric conversion device 200 illustrated in FIG. 6, a slit 3 may be provided to penetrate through a light receiving portion 1 and reach a supporting substrate 2.

In the photoelectric conversion device 100 according to the first embodiment, as structural parameters of the slit 3 provided in the light receiving portion 1, the width w and the depth d determine the efficiency of conversion into surface plasmons.

In order to form a resonance mode (waveguide mode) in the slit 3, the width w of the slit 3 is preferably equal to or smaller than half the wavelength to be detected, and the conversion efficiency is also maximized when the width w is about half the wavelength to be detected. For example, regarding a case where the light receiving portion 1 is made of silver, and the slit depth d is 3 micrometers, for perpendicular incident light with a wavelength of 600 nm, analyses were conducted through the FDTD (Finite Difference Time Domain) method, which revealed that slit widths in the range of about 250 nm to 350 nm could attain maximum coupling efficiency (surface plasmon conversion).

In cases where the slit 3 does not penetrate through the light receiving portion 1 as illustrated in FIG. 2, the depth d of the slit 3 is preferably equal to or less than 100 nm in order to generate near-field light, and when the width d falls within this range, it is possible to attain maximum coupling efficiency. On the other hand, in cases where the slit 3 penetrates through the light receiving portion 1 as illustrated in FIG. 6, the depth d of the slit 3 is required to be larger than the length of the intrusion of the wavelength of the incident light into the material of the light receiving portion 1.

Figure 7:
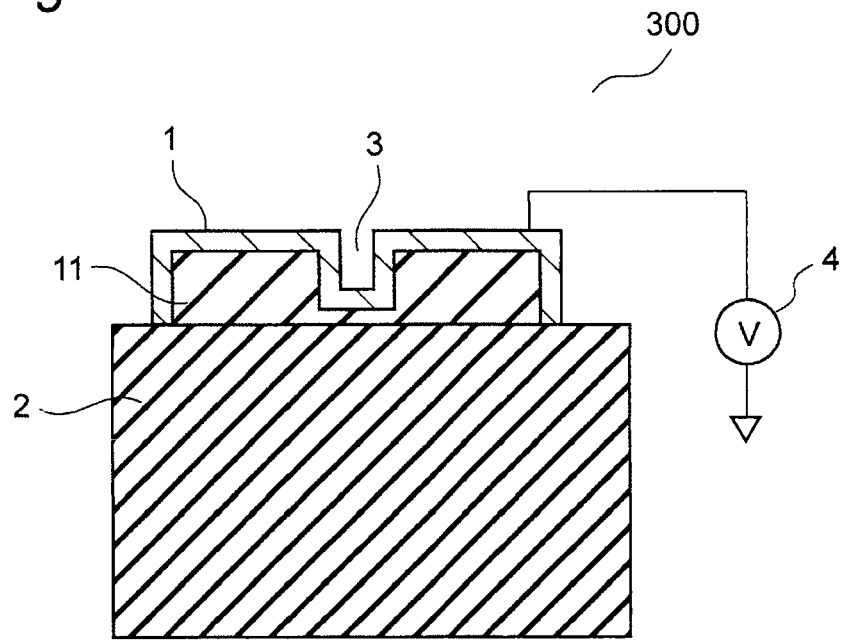
FIG. 7 is a cross-sectional view of a different photoelectric conversion device according to the first embodiment of the present invention.

FIG. 7 is a cross-sectional view of an entire different photoelectric conversion device 300 according to the first embodiment. The photoelectric conversion device 300 includes a nano-structure 11 provided with a slit on a supporting substrate 2, and a light receiving portion 1 formed thereon through metal sputtering or the like. The nano-structure 11 is made of silicon, for example. The thickness of the metal forming the light receiving portion 1 is required only to be larger than the length of the intrusion of the wavelength of incident light. That is, the metal forming the light receiving portion 1 is required to have a thickness for preventing the incident light from passing therethrough. For example, when the incident light has a wavelength of 5 micrometers and the light receiving portion 1 is made of gold, the incident light intrudes into the light receiving portion 1 by a length of about 10 nm, and therefore, the light receiving portion 1 is required only to have a thickness of 50 nm.

As described above, the photoelectric conversion device according to the first embodiment is capable of converting even light incident to its front surface perpendicularly thereto into surface plasmons (or surface plasmon polaritons) propagating along the front surface. Furthermore, the photoelectric conversion device is capable of detecting the incident light by detecting such surface plasmons (or surface plasmon polaritons). Further, this eliminates the necessity of a prism and the like for adjusting the incident angle θ, which simplifies the structure of the photoelectric conversion device.

Further, since the voltage between the front surface of the light receiving portion 1 and the reference point (for example, a grounded point) is detected, it is not necessary to provide an electrode on the rear surface of the photoelectric conversion device, which enables simplification of the structure.

Second Embodiment

Figure 8:
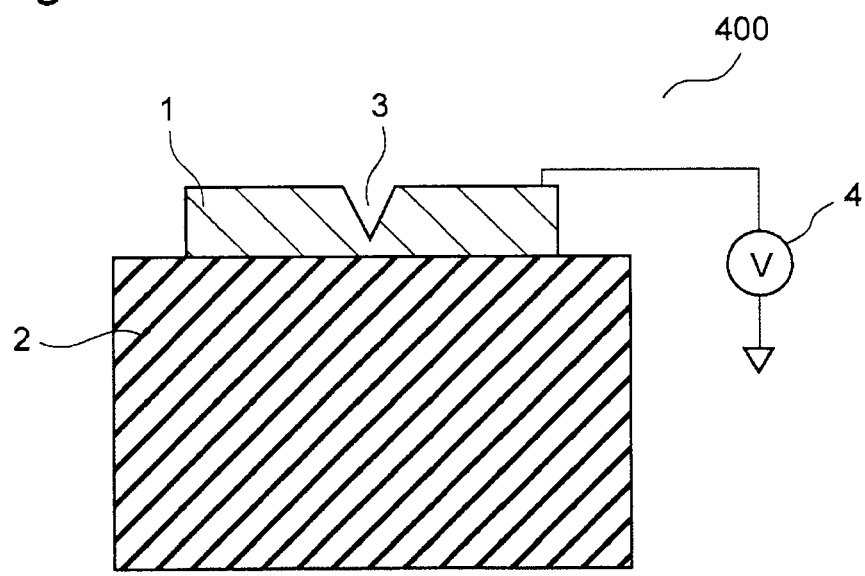
FIG. 8 is a cross-sectional view of a photoelectric conversion device according to a second embodiment of the present invention.

FIG. 8 is a cross-sectional view of an entire photoelectric conversion device 400 according to a second embodiment of the present invention. In FIG. 8, the same symbols as those in FIGS. 1 and 2 designate the same or corresponding portions. The photoelectric conversion device 400 has the same structure as that of the photoelectric conversion device 100 described above, except that the slit 3 has a wedge shape in cross section.

Since, in the photoelectric conversion device 400, the slit 3 is formed to have a wedge shape in cross section (a V-shaped slot), an electric field is caused to locally exist in an extremely narrow space at the bottom of the slit 3, which intensifies the electric field. This enables selectively increasing the electric field intensity of the wavelength to be converted into surface plasmons at the bottom of the slit 3, thus resulting in an increase of the efficiency of coupling of the wavelength to surface plasmons.

Further, in the photoelectric conversion device 400, the wall surfaces of the slit 3 are not vertical unlike those of the photoelectric conversion device 100, which enables changing the matching relation of Equation 3, thereby changing the wavelength to be coupled to surface plasmons. More specifically, assuming that the angle of inclination of the wall surfaces of the slit 3 (the angle thereof with respect to a vertical line) is φ, it is possible to control the angle θ in (Equation 4) through the angle φ. This indicates that the efficiency of conversion into surface plasmons and the wavelength to be converted can be controlled by the angle φ. This enables selecting the wavelength to be detected by changing the shape of the slit 3 (the angle φ of inclination of the wall surfaces).

Third Embodiment

Figure 9:
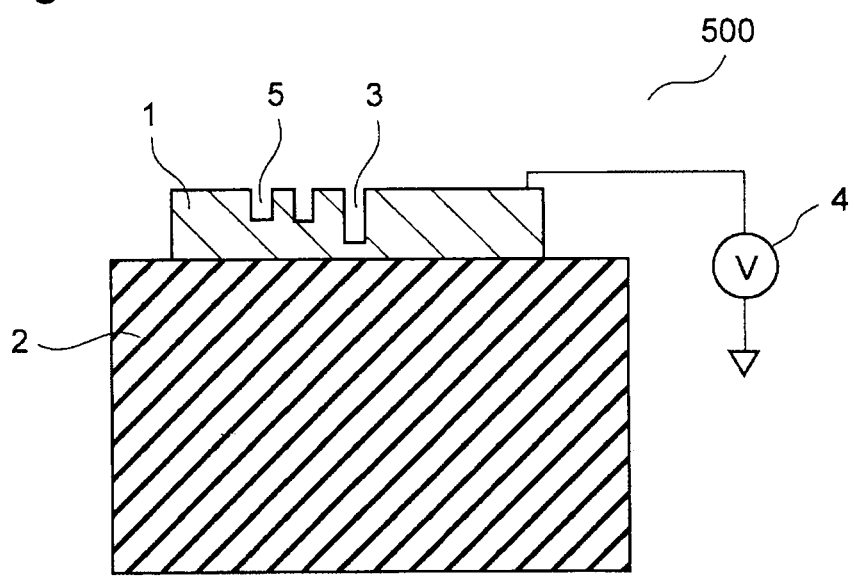
FIG. 9 is a cross-sectional view of a photoelectric conversion device according to a third embodiment of the present invention.

FIG. 9 is a cross-sectional view of an entire photoelectric conversion device 500 according to a third embodiment of the present invention. In FIG. 9, the same symbols as those in FIGS. 1 and 2 designate the same or corresponding portions. The photoelectric conversion device 500 includes a light receiving portion 1 having a slit 3, and slot-shaped reflection slits 5 placed in parallel with the slit 3.

The reflection slits 5 are provided on the opposite side, with respect to the slit 3, from the portion for measuring an electric potential by a voltage detection device 4. The reflection slits 5 have a rectangular shape in vertical cross section, and have a depth d smaller than that of the slit 3 and a width w substantially equal to that of the slit 3. The number of the reflection slits 5 provided therein is preferably more than one. As will be described later, the larger the number of the reflection slits 5, the higher the efficiency of detection of surface plasmons. Further, the reflection slits 5 can be considered to be a Bragg diffraction grating, and its period (pitch) is about ¼ the wavelength to be detected.

In this case, assuming that the wavenumber of surface plasmons is ksp, the period (pitch) of the reflection slits 5 is P, and the order of plasmons is m, the reflectivity is made higher when the following relation is satisfied.

$$k_{sp}P = m\pi \qquad \text{(Equation 7)}$$

Accordingly, by providing the reflection slits 5 in such a way as to satisfy Equation 7, surface plasmons on the side provided with the reflection slits 5, out of the surface plasmons induced on the both sides opposite to each other with respect to the slit 3, are reflected by the reflection slits 5 and are transmitted to the voltage detection portion 4, which increases the surface plasmon intensity at the voltage detection portion 4. This increases the voltage detected by the voltage detection portion 4, thereby increasing the photoelectric conversion efficiency and the detection efficiency.

Fourth Embodiment

Figure 10:
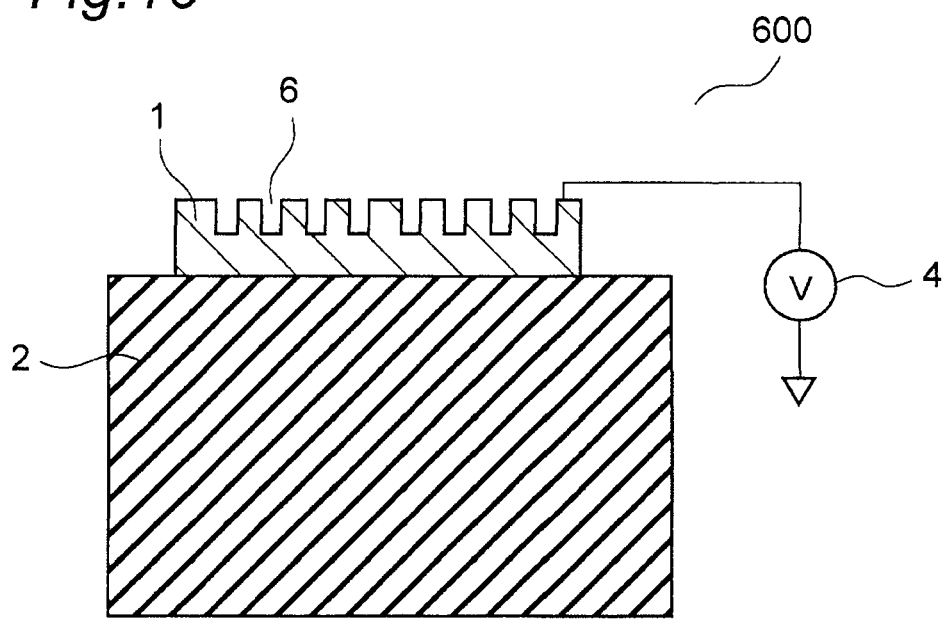
FIG. 10 is a cross-sectional view of a photoelectric conversion device according to a fourth embodiment of the present invention.

FIG. 10 is a cross-sectional view of an entire photoelectric conversion device 600 according to a fourth embodiment of the present invention. In FIG. 10, the same symbols as those in FIGS. 1 and 2 designate the same or corresponding portions. The photoelectric conversion device 600 includes a light receiving portion 1 having a plurality of slot-shaped slits 6 periodically provided therein in parallel at a predetermined pitch. The period (pitch) of the slits 6 is substantially equal to the wavelength to be detected.

By providing such a periodic structure in the front surface of the detection portion 1 as described above, it is possible to excite surface plasmons by ordinary incident light. More specifically, assuming that the wavenumber vector of surface plasmons is as follows, $\vec{k}_{sp}$ the wavenumber vector of incident light is as follows, and $\vec{k}_{inc}$ the reciprocal lattice vector is as follows, $\vec{g}$ the following relation holds.

$$\vec{k}_{sp} = \vec{k}_{inc} + \vec{g} \quad \text{(Equation 8)}$$

For example, in a case of a one-dimensional periodic structure, assuming that the wavenumber of surface plasmons is as follows, $k_{sp}$ the wavenumber of incident light is as follows, $k_0$ the incident angle is θ, the period (pitch) of the structure is T, and m is an integer, the following relation holds.

$$k_{sp} = k_0 \sin\theta + m \times \frac{2\pi}{T} \quad \text{(Equation 9)}$$

As can be clearly understood from Equation 9, it is possible to overcome the wavenumber mismatching with the periodic structure, which enables exciting surface plasmons even by perpendicular incident light (θ=0) and causing them to be coupled to the front surface. Further, in such cases of perpendicular incident light, the mode excited along the front surface is substantially coincident with the period. Accordingly, by providing the periodical slits 6 in the front surface of the light receiving portion 1, it is possible to increase the efficiency of converting light with a certain wavelength coincident with the period into surface plasmons, thereby enabling wavelength-selective detection.

Fifth Embodiment

Figure 11:
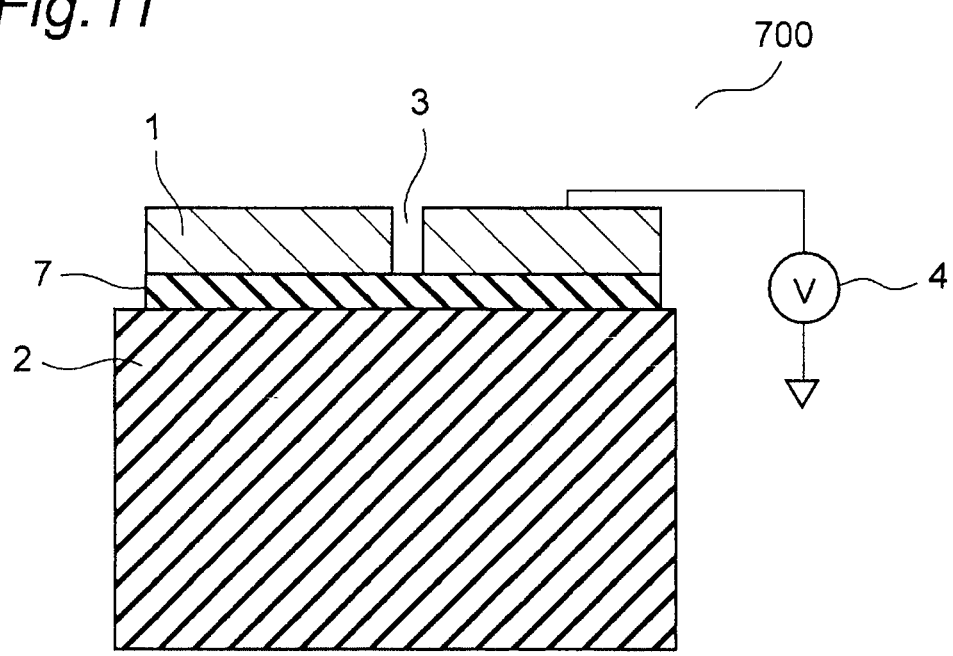
FIG. 11 is a cross-sectional view of a photoelectric conversion device according to a fifth embodiment of the present invention.

FIG. 11 is a cross-sectional view of an entire photoelectric conversion device 700 according to a fifth embodiment. In FIG. 11, the same symbols as those in FIGS. 1 and 2 designate the same or corresponding portions. The photoelectric conversion device 700 includes an insulation layer 7 provided on a supporting substrate 2, and a light receiving portion 1 provided thereon. The insulation layer 7 is made of $SiO_2$, SiN, or HSQ (Hydrogen Silsesquioxane), for example. Further, similarly to the photoelectric conversion device 200, a slit 3 is structured to penetrate through the light receiving portion 1.

In the photoelectric conversion device 700, surface plasmons resulted from the conversion by the slit 3 are caused to locally exist in the insulation layer 7 under the slit 3, as well as at the front surface of the light receiving portion 1. The thickness of the insulation layer 7 depends on the materials of the light receiving portion 1 and the supporting substrate 2 thereunder, and also on the length of the intrusion of light which depends on the wavelength to be detected. For example, in cases where the light receiving portion 1 is made of silver, the thickness of the insulation layer 7 is about 10 nm to 100 nm.

As described above, in the photoelectric conversion device 700, surface plasmons resulted from the conversion by the slit 3 are caused to locally exist at the emission surface of the slit 3 (its boundary surface abutting on the insulation layer 7), as well as at the front surface of the light receiving portion 1. This allows the surface plasmons to propagate along both the front surface and the rear surface of the light receiving portion 1, which can increase the detected voltage, thereby increasing the detection efficiency.

Sixth Embodiment

Figure 12:
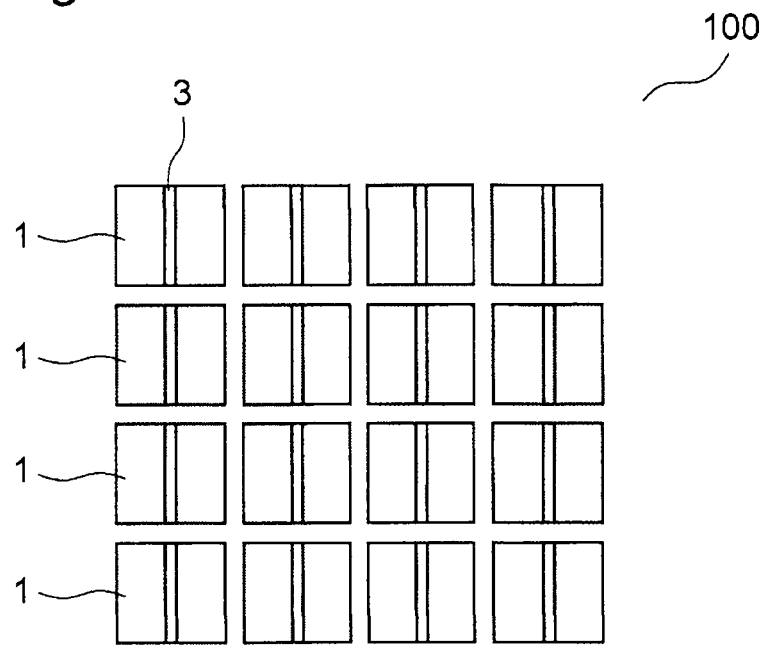
FIG. 12 is a plan view of a photoelectric conversion device array according to a sixth embodiment of the present invention.

FIG. 12 is a top view of a photoelectric conversion device array constituted by the photoelectric conversion devices 100 arranged in a matrix shape. The photoelectric conversion devices may be constituted by any one of the photoelectric conversion devices described in the first to fifth embodiments. Further, in FIG. 12, the voltage detection portion 4 is not illustrated.

The photoelectric conversion devices according to any one of the first to fifth embodiments are made to form an array such that each photoelectric conversion device configures a single unit (pixel), which can form an image sensor. Each single pixel is required only to include a slit 3 with a width w of several hundreds nanometers, which enables making its size smaller than those of conventional pixels having sizes of several micrometers, thereby improving the resolution.

Further, the photoelectric conversion device in JP 8-264821, A referred to above cannot induce surface plasmons by perpendicular incident light (with an incident angle θ=0), and therefore, has not been applicable to an image sensor. On the contrary, the photoelectric conversion devices according to the first to fifth embodiments are capable of inducing surface plasmons even by perpendicular incident light, and therefore, can be applied to image sensors as in FIG. 12.

Seventh Embodiment

Figure 13:
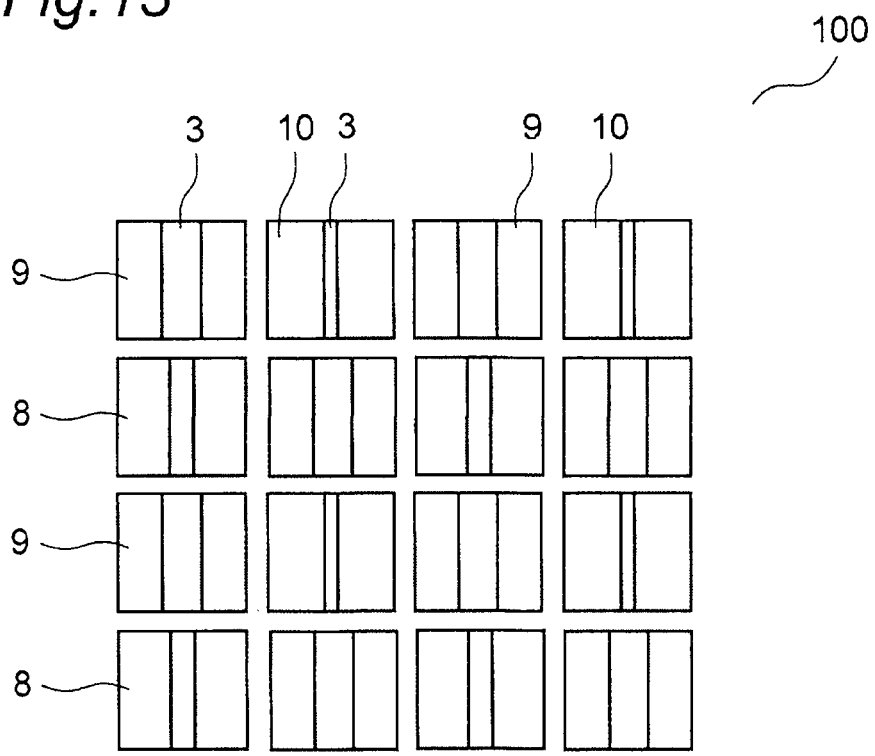
FIG. 13 is a plan view of a photoelectric conversion device array according to a seventh embodiment of the present invention.

FIG. 13 is a top view of a photoelectric conversion device array constituted by the photoelectric conversion devices 100 arranged in a matrix shape. The photoelectric conversion device array includes three types of pixels for different wavelengths to be detected, namely, pixels 8 for a wavelength λ1 to be detected, pixels 9 for a wavelength λ2 to be detected, and pixels 10 for a wavelength λ3 to be detected. The wavelength to be detected in each pixel is selected by changing the width w of the slit 3 formed in the light receiving portion 1 and thus changing the wavelength which can be converted into surface plasmons with higher efficiency. As in FIG. 11, by providing the three types of photoelectric conversion devices, it is possible to provide a photoelectric conversion device array having resolutions for three types of wavelengths.

As described above, by varying the shape (particularly, the width) of the slit 3 in each photoelectric conversion device constituting a pixel, it is possible to perform resolution (selection) of a wavelength to be detected. For example, in the visible range, the wavelengths to be detected can be set as RED, GREEN, and BLUE, which enables detection of color images.

What is claimed is:

1. A photoelectric conversion device utilizing surface plasmons, comprising:
   a plate-shaped light receiving portion made of metal, provided on a most superficial surface of the photoelectric conversion device, and having a front surface and a rear surface so as to receive incident light at the front surface;
   a slot-shaped slit provided in the front surface of the light receiving portion; and
   a voltage detection portion adapted to measure an electric potential at the front surface of the light receiving portion; wherein
   the incident light is caused to excite surface plasmons through the slit, and an electric potential at the front surface of the light receiving portion induced by the surface plasmons is measured by the voltage detection portion.

2. The photoelectric conversion device according to claim 1, wherein
   a portion of the incident light is reflected by the slit to excite surface plasmons through surface plasmon resonance.

3. The photoelectric conversion device according to claim 1, wherein
   the slit has a rectangular shape in cross section vertical to the front surface of the light receiving portion.

4. The photoelectric conversion device according to claim 1, wherein
   the slit has a V-shape in cross section vertical to the front surface of the light receiving portion.

5. The photoelectric conversion device according to claim 1, further comprising:
   a slot-shaped reflection slit placed in parallel to the slit, in the front surface opposite, with respect to the slit, from the front surface connected to the voltage detection portion.

6. The photoelectric conversion device according to claim 1, wherein
   the light receiving portion includes a plurality of slot-shaped slits provided in parallel at a predetermined period.

7. The photoelectric conversion device according to claim 1, wherein
   the light receiving portion is connected at the rear surface to a front surface of an insulating layer, and the front surface of the insulating layer is exposed at a bottom portion of the slit.

8. An image sensor comprising the photoelectric conversion devices according to any one of claims 1 to 7, which are arranged in a matrix shape.

9. The image sensor according to claim 8, comprising photoelectric conversion devices having slits with different widths.

* * * * *